(12) United States Patent
Lunadier (10) Patent No.: US 9,898,362 B2
(45) Date of Patent: Feb. 20, 2018

(54) MULTI-CHANNEL RAM WITH ECC FOR PARTIAL WRITES

(71) Applicant: Atmel Corporation, San Jose, CA (US)

(72) Inventor: Franck Lunadier, Trets (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 15/093,342

(22) Filed: Apr. 7, 2016

(65) Prior Publication Data

US 2017/0293523 A1 Oct. 12, 2017

(51) Int. Cl.
*G06F 11/10* (2006.01)
*G11C 29/52* (2006.01)
*G06F 3/06* (2006.01)

(52) U.S. Cl.
CPC .......... *G06F 11/1068* (2013.01); *G06F 3/064* (2013.01); *G06F 3/0619* (2013.01); *G06F 3/0644* (2013.01); *G06F 3/0659* (2013.01); *G06F 3/0679* (2013.01); *G11C 29/52* (2013.01)

(58) Field of Classification Search
CPC .................................................. G06F 11/1008
USPC ........................................ 714/766, 763, 768
See application file for complete search history.

(56) References Cited

U.S. PATENT DOCUMENTS

| | | | | |
|---|---|---|---|---|
| 4,276,594 A * | 6/1981 | Morley | ................. | G06F 13/124 713/600 |
| 4,884,271 A * | 11/1989 | Concha | ............... | G06F 11/1056 714/764 |
| 5,506,977 A | 4/1996 | Jones | | |
| 5,987,628 A * | 11/1999 | Von Bokern | ........ | G06F 11/1048 714/48 |
| 2006/0184858 A1* | 8/2006 | Harrand | ............... | G06F 11/1008 714/763 |

* cited by examiner

*Primary Examiner* — Fritz Alphonse
(74) *Attorney, Agent, or Firm* — Fish & Richardson P.C.

(57) ABSTRACT

Systems, methods, circuits and computer-readable mediums for multi-channel RAM system with error-correcting code (ECC) protection for partial writes are provided. In one aspect, a method includes accessing a plurality of bursts of partial data units from a plurality of respective bus ports, forming a plurality of memory addresses for a plurality of memory channels by interleaving addresses from the plurality of bus ports, and performing read-modify-write (RMW) error-correcting code (ECC) processes to write partial data units from the plurality of bursts into memory portions corresponding to the formed memory addresses in the plurality of memory channels.

20 Claims, 6 Drawing Sheets

MULTI-CHANNEL RAM WITH ECC FOR PARTIAL WRITES

TECHNICAL FIELD

This disclosure relates generally to memory systems, particularly to random-access memory (RAM) with error-correcting code (ECC) protection.

BACKGROUND

In an example scenario, 8-bit ECC is used to protect data in a memory, e.g., a RAM, where each memory data byte is associated with a 5-bit single-error correcting and double-error detecting (SECDED) ECC word. Partial writes (or sub-word writes) of single byte (i.e., 8-bit) data can be performed without reading memory data from the memory, and ECC write of the single byte data can be achieved in a single clock cycle. However, the SECDED ECC word for 8-bit ECC has a silicon area overhead of 62.5%. In another example scenario, using ECC to protect words of 32 bits or more enable silicon area to be saved when compared to a similar methodology for 8-bit ECC, but it may take several clock cycles to complete. For example, data is read from a memory and the read data is executed with ECC check; then, partial writes with one or more bytes that are to be written are merged with the read data, the corresponding new ECC bits are computed, and the total data is written into the memory. In some example scenarios, however, the memory does not permit such combinational ECC computation during access to the memory.

SUMMARY

This specification describes systems, methods, circuits and computer-readable mediums for multi-channel RAM system with ECC protection for multiple bursts of partial writes. In one aspect, a non-transitory computer-readable storage medium having instructions stored thereon which, when executed by one or more processors, cause the one or more processors to perform operations including: accessing a plurality of bursts of partial data units from a plurality of respective bus ports, forming a plurality of memory addresses for a plurality of memory channels by interleaving addresses from the plurality of bus ports, and performing read-modify-write (RMW) error-correcting code (ECC) processes to write partial data units from the plurality of bursts into memory portions corresponding to the formed memory addresses in the plurality of memory channels. The interleaving of the addresses includes: providing a first address from a first bus port of the plurality of bus ports to a first memory channel of the plurality of memory channels to form a first memory address, providing a second address from a second bus port of the plurality of bus ports to the first memory channel to form a second memory address, providing a third address from the first bus port to a second memory channel of the plurality of memory channels to form a third memory address, and providing a fourth address from the second bus port to the second memory channel to form a fourth memory address.

The details of one or more disclosed implementations are set forth in the accompanying drawings and the description below. Other features, aspects, and advantages will become apparent from the description, the drawings and the claims.

DETAILED DESCRIPTION

The description that follows is an example system that includes a memory controller for performing multiple bursts of partial and/or full writes from multiple bus masters to a multi-channel memory system with ECC protection via multiple bus ports. In this example, the memory system is a multi-channel random-access memory (RAM) system. The disclosed implementations can be adapted to any memory system or data storage system where there is a desire to communicate between multiple bus masters and multiple memory channels.

Example Memory System

Figure 1A:
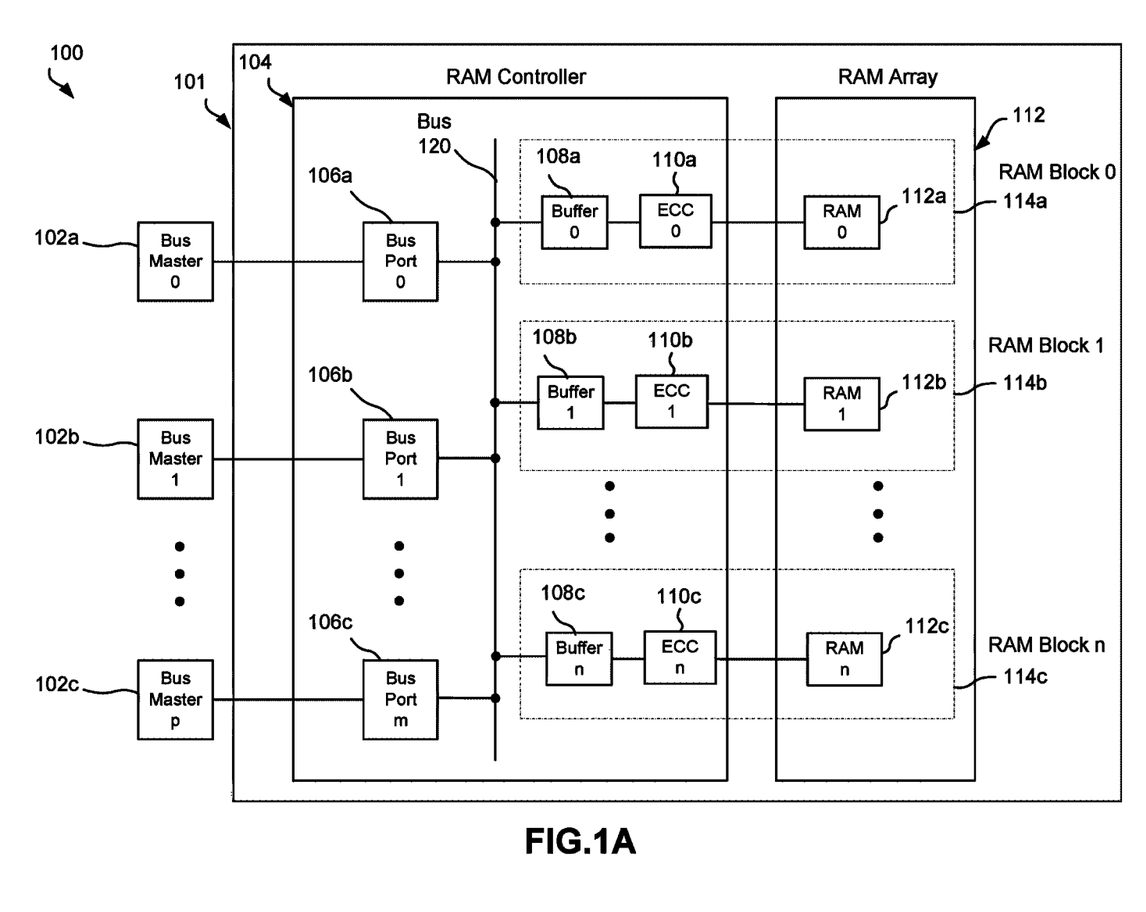
FIG. 1A is a block diagram of an example memory system, according to an example embodiment.

FIG. 1A is a block diagram of an example memory system 100, according to an example implementation. The system 100 has a multi-channel RAM array 112 including a number of RAM channels (from 0 to n) 112a, 112b, 112c. A number of bus masters (from 0 to p) 102a, 102b, 102c, access (e.g., write data to or read data from) the RAM channels 112a, 112b, and 112c, through a RAM controller 104.

Figure 1B:
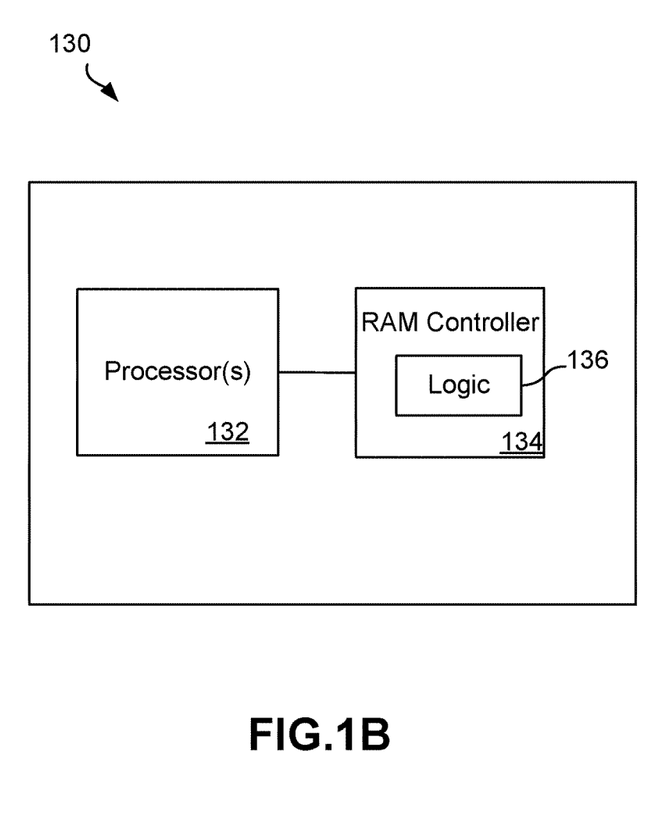
FIG. 1B is a block diagram of an example system including an example RAM controller, according to an example embodiment.
Figure 1C:
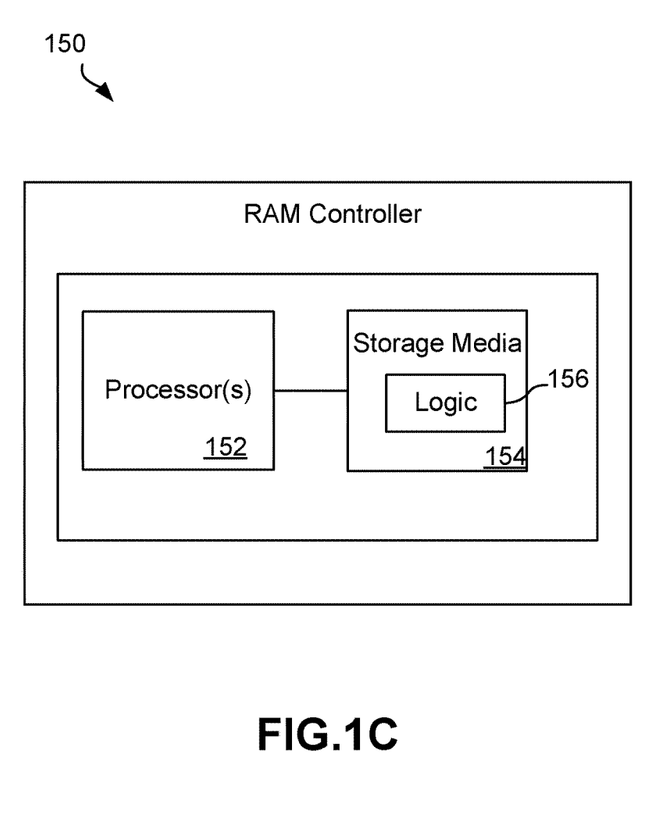
FIG. 1C is a block diagram of an example RAM controller, according to another example embodiment.

The RAM controller 104 communicates data between the multiple bus masters and the multiple RAM channels and performs ECC for the data. FIG. 1B is a block diagram of an example system 130 according to an implementation. The system 130 includes an example RAM controller 134 external to one or more processors 132. The RAM controller 134 includes logic 136 configured to cause the processors 132, when executed by the processors 132, to perform actions. FIG. 1C is a block diagram of an example RAM controller 150, according to another implementation. The RAM controller 150 includes one or more processors 152 and one or more storage media 154 coupled to the processors 152. The storage media 154 further stores logic 156 configured to cause the processors 152, when executed by the processors 152, to perform actions.

The bus masters can be a central processing unit (CPU), a controller, an I/O processor, a peripheral processor, and/or any other devices. The RAM channels can be static RAMs (SRAMs) and/or dynamic RAMs (DRAMs). Each RAM channel can be the same as or different from one another. In an embodiment, the RAM array 112 is embedded (or integrated) in a microcontroller 101, together with the RAM controller 104. In some embodiments, the microcontroller 101 and the RAM controller 104 have different processors and/or memories. In some embodiments, the microcontroller 101 and the RAM controller 104 share resources, e.g., some or all of the processors and/or memories.

The RAM controller 104 includes a respective buffer system and an ECC circuit for each RAM channel. The ECC circuits for the RAM channels can be integrated in a single circuit. Each RAM channel with associated buffer system and ECC circuit can be considered as an individual RAM block. For example, RAM block 114a includes buffer system 108a and ECC circuit 110a, RAM block 114b includes buffer system 108b and ECC circuit 110b, and RAM block 114c includes buffer system 108c and ECC circuit 110c.

The RAM controller 104 includes a number of bus ports (from 0 to m) 106a, 106b, 106c. In an embodiment, one or more bus masters access one or more RAM channels through a bus port that is connected (or coupled) to the one or more RAM channels. In an embodiment, the RAM controller 104 includes a system bus 120. Each bus port is coupled to the system bus 120, and each RAM block is coupled to the system bus 120. Each bus master can access any RAM channel (or RAM block) through any bus port and the system bus 120. The number of bus masters p can be the same as or different from the number of bus ports m. The number of bus ports m can be the same as or different from the number of RAM channels n. In one embodiment, the number of RAM channels n is twice as the number of bus ports m, that is, n=2m.

For each RAM block, the buffer system includes at least one buffer for registering data from a bus port to the respective RAM channel. In one example implementation, the buffer system includes multiple buffers for registering data from multiple bus ports, e.g., simultaneously, to the same RAM channel. The number of buffers in the bus system can be the same as the number of bus ports m. The number of buffers can be also smaller than the number of bus ports.

For each RAM block, the ECC circuit is configured to detect and correct any bit error in data that is read from the respective RAM channel and to encode data to be stored into the respective RAM channel with check bits (or parity data) that are derived from the data and for error detection and/or correction.

Figure 1D:
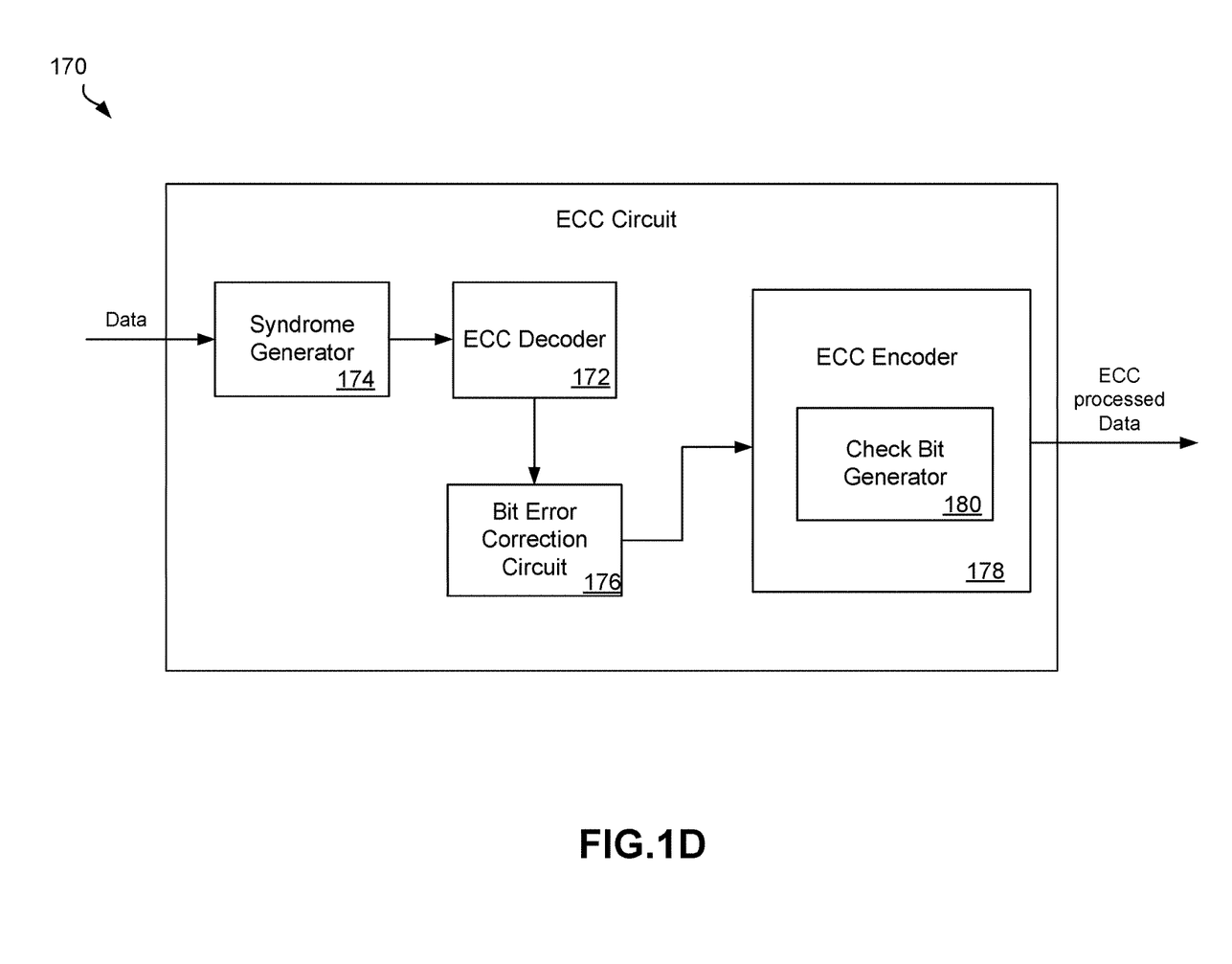
FIG. 1D is a block diagram of an example ECC circuit, according to an example embodiment.

FIG. 1D is a block diagram of an example ECC circuit 170. In an embodiment, the ECC circuit 170 includes an ECC decoder 172. In one example implementation, the ECC circuit 170 includes a syndrome generator 174. In another example implementation, the ECC decoder 172 includes the syndrome generator 174. The syndrome generator 174 generates a set of check bits based upon data read from the RAM channel and compares the data with ECC check bits that are accessed (e.g., together with the data) from the RAM channel by the RAM controller 104. Based on a result of the comparison, the syndrome generator 174 generates a unique code word (syndrome) which can be utilized to identify a single bit in error. This syndrome word can point to any single bit error in the data or ECC bits.

The ECC decoder 172 is configured to decode the syndrome from the syndrome generator 174. The ECC decoder 172 produces output status bits to indicate that (1) no error occurred, (2) a single bit error occurred in the ECC bits or in bytes one, two, three, or four of the data, or (3) a double error occurred. In one example implementation, if a single bit data error exists, the ECC decoder 172 generates a signal which indicates the data bit position in error. A single bit error correction circuit 176 in the ECC circuit 170 receives the signal from the ECC decoder 172, identifies the data bit position in error based on the received signal, and corrects (e.g., inverts) the bit in error. All the other data bits pass through the single bit error correction circuit 176 unchanged. In one example implementation, if a single bit error is found in one of the check bits or in a data bit in one of partial words to be over-written (or replaced) by data from a bus master (e.g., insignificant bit) during a read-modify-write (RMW) operation, then no correction is required. The ECC decoder 172 can include the single bit error correction circuit 176.

In an embodiment, the ECC circuit 170 includes an ECC encoder 178. The ECC encoder 178 includes a check bit generator 180 configured to generate check bits (e.g., parity bits) on data to be written into storage, e.g., the respective RAM channel. The ECC check bit generator 180 can use at least one type of Hamming-code based algorithm which provides single error correction as a minimum. In one example implementation, the ECC check bit generator 180 generates six bits for single error correction and one additional bit for double error detection for a 32-bit word size storage. The ECC check bit generator 180 can also generate eight check bits for a 64-bit word size storage.

In an embodiment, for each RAM block, the RAM controller 104 includes one or more bytes mergers. In one example implementation, the number of bytes mergers is the same as the number of buffers in the RAM block. Each byte merger is configured to merge a partial word registered in a respective buffer with data read from the respective RAM channel and decoded by the ECC circuit (e.g., an ECC decoder) into a full word.

The RAM controller 104 can have sub-word bus write capability, e.g., byte write strobe capability. The RAM controller 104 enables a "read-modify-write" (RMW) ECC process to be performed so as to write partial words (or sub-words). In a first cycle, a read address is sampled by a RAM block. In a second cycle, the read data is sampled by the RAM controller 104, an ECC syndrome is computed and data may be corrected if a single bit error exists. In a third cycle, the corrected word is modified (or merged) with partial word bits transferred from a bus master through a bus port. Corresponding new ECC bits are computed, e.g., by an ECC encoder, and the encoded full word with ECC check bits is written into the RAM channel. The RMW ECC process may be implemented in several clock cycles for words of 32 bits or more.

Figure 3:
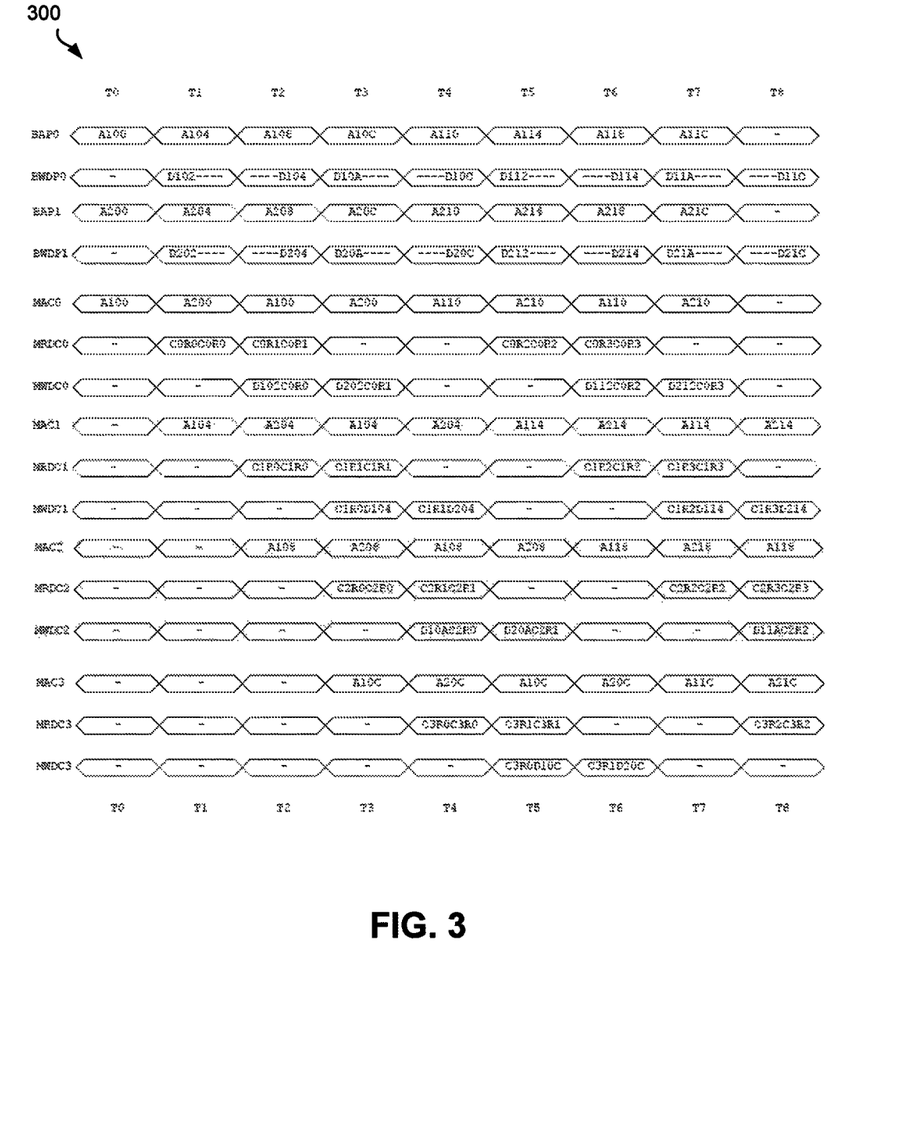
FIG. 3 is an example timing diagram of concurrent bursts of partial writes from the bus ports to the RAM channels of FIG. 2, according to an example embodiment.

As discussed in further details below, the RAM controller 104 enables to simultaneously perform RMW ECC processes for multi-bytes partial data bursts concurrently from multiple bus ports by interleaving addresses from the bus ports for multiple RAM blocks (e.g., multiple RAM channels), which enables single cycle RAM access for partial word writes instead of a few cycles. For example, as illustrated in FIG. 3, with one cycle, the RAM controller 104 receives two partial data units from two bus ports and writes two RMW ECC processed partial data units into memory portions corresponding to two memory addresses in two different memory channels. That is, single cycle RAM access for partial word writes is obtained. Partial write data can be accepted with no latency, and multiple data bursts can be maintained indefinitely due to available bandwidth provided by multiple RAM channels connected to multiple bus ports.

In one embodiment, the RAM controller 104 forms memory addresses for the multiple memory channels 112a, 112b, 112c by interleaving addresses from the multiple bus ports 106a, 106b, 106c. For example, the RAM controller 104 receives a first address from bus port 106a and a second address from bus port 106b and provides the first address and the second address to the first RAM channel 112a as first and second memory addresses. The RAM controller 104 can also receive a third address from bus port 106a and a fourth address from bus port 106b and provide the third address and the fourth address to the second RAM channel 112b as third and fourth memory addresses. The third address is sequential to the first address for bus port 106a and the fourth address is sequential to the second address for bus port 106b. The first and second memory addresses are sequential in the first RAM channel 112a, and the third and fourth memory addresses are sequential in the second RAM channel 112b.

Example RAM Controller

Figure 2:
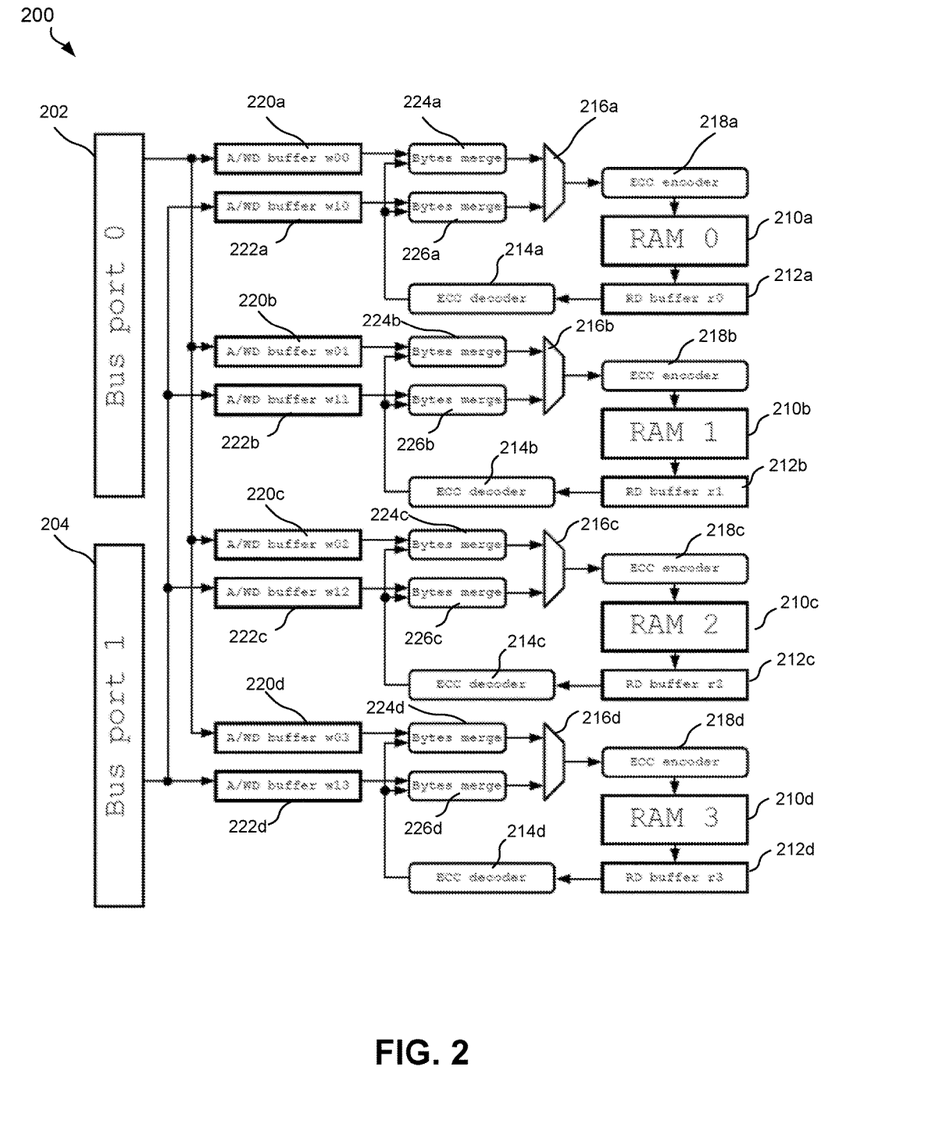
FIG. 2 is a block diagram of an example RAM controller for partial writes from two bus ports to four RAM channels with ECC protection, according to an example embodiment.

FIG. 2 is a block diagram of an example RAM controller 200 for partial writes from two bus ports 202, 204 to four RAM channels 210a, 210b, 210c, 210d. The RAM controller 200 can be similar to the RAM controller 104 of FIG. 1A. The RAM controller 200 is configured to write, e.g., concurrent, bursts of partial and/or full words from the two bus ports to the four RAM channels by forming memory addresses for the RAM channels 210a, 210b, 210c, 210d using interleaved bus port addresses from the bus ports 202, 204.

Each RAM channel is associated with two A/WD (access/write data) buffers each for registering data from an individual bus port 202 or 204, two bytes mergers each for merging data from a respective A/WD buffer. The RAM channel, A/WD buffers and the bytes mergers can be considered in a RAM block. The RAM block can also include an RD (read data) buffer for storing data read from the RAM channel. The RAM block also includes an ECC circuit including an ECC decoder and an ECC encoder. In an embodiment, the RAM block includes a selection circuit for selecting one of the merged data from the two bytes mergers.

For example, RAM block 0 includes RAM channel 210a, A/WD buffer (w00) 220a coupled to bus port (0) 202, A/WD buffer (w10) coupled to bus port (1) 204, bytes merger 224a coupled to A/WD buffer 220a, bytes merger 226a coupled to A/WD buffer 222a, selection circuit 216a, RD buffer (r0) 212a, ECC decoder 214a, and ECC encoder 218a.

RAM block 1 includes RAM channel 210b, A/WD buffer (w01) 220b coupled to bus port (0) 202, A/WD buffer (w11) 222b coupled to bus port (1) 204, bytes merger 224b coupled to A/WD buffer 220b, bytes merger 226b coupled to A/WD buffer 222b, selection circuit 216b, RD buffer (r1) 212b, ECC decoder 214b, and ECC encoder 218b.

RAM block 2 includes RAM channel 210c, A/WD buffer (w02) 220c coupled to bus port (0) 202, A/WD buffer (w12) coupled to bus port (1) 204, bytes merger 224c coupled to A/WD buffer 220c, bytes merger 226c coupled to A/WD buffer 222c, selection circuit 216c, RD buffer (r2) 212c, ECC decoder 214c, and ECC encoder 218c.

RAM block 3 includes RAM channel 210d, A/WD buffer (w03) 220d coupled to bus port (0) 202, A/WD buffer (w13) coupled to bus port (1) 204, bytes merger 224d coupled to A/WD buffer 220d, bytes merger 226d coupled to A/WD buffer 222d, selection circuit 216d, RD buffer (r3) 212d, ECC decoder 214d, and ECC encoder 218d.

The operation of the RAM controller 200 is described in further details below with respect to FIG. 3.

Example Timing Diagram

FIG. 3 is an example timing diagram 300 of concurrent bursts of partial writes to the four RAM channels of FIG. 2, according to an example embodiment. The diagram 300 shows waveforms of an example sequence of 32-bit partial writes bursts starting simultaneously from the two bus ports 202 and 204 of the RAM controller 200. For purpose of illustration, the diagram 300 includes the waveforms chronologically from T0 to T8, each representing a cycle.

The RAM controller 200 uses an interleaved address scheme. In one example implementation, RAM block 0 holds data whose bus port address is 0x00, 0x10, 0x20, . . . RAM block 1 holds data whose bus port address is 0x04, 0x14, 0x24, . . . RAM block 2 holds data whose bus port address is 0x08, 0x18, 0x28, . . . RAM block 3 holds data whose bus port address is 0x0C, 0x1C, 0x2C, . . . . The bus port addresses for each RAM block (e.g., each RAM channel) are from the bus ports 202 and 204. Each RAM physical block address can be formed by discarding an hexadecimal address digit at a right hand of a RAM channel address originating from any bus port address.

In the waveform diagram 300, the RAM channel address is represented. The RAM channel x (0, 1, 2, or 3) shows a write access at the address MACx if the channel write data MWDCx shows a defined value, otherwise the address MACx is a read address whose corresponding data is driven onto the channel read data MRDCx in a next cycle.

As an example, the waveform chronology below is described for RAM channel 210a and involves features represented mainly in the associated schematic diagram for simplicity. The three other channels follow a substantially same pattern sequence beginning one clock cycle after another one clock cycle, respectively.

During T0, the two bus ports 202 and 204 receive simultaneous requests for bursts of partial writes targeting a same RAM channel, e.g., RAM 210a. The RAM controller 200 can perform an arbitration between the two bursts to determine which burst has a higher priority to access the RAM channel. As an example, through the arbitration, the burst of partial writes from bus port (BAP) 202 is selected and the request and address from the bus port 202 (BAP0=A100), are forwarded to the RAM channel 210a with address MAC0=A100 as a read request. Within T0, the request from the bus port 204 at address BAP1=A200 is registered into the A/WD buffer (w10) 222a.

During T1, first data "C0R0C0R0" read from RAM channel 210a (MRDC0) is registered into RD buffer (r0) 212a for a first write into RAM channel 210a. The registered request BAP1=A200 is forwarded onto RAM Channel 210a MAC0=A200 as a read request. Within T1, partial write data BWDP0=D102, i.e., the first partial data unit of the first burst from bus port 202 is registered into the A/WD buffer (w00) 220a, and partial write data BWDP1=D202, i.e., the first partial data unit of the second burst, from the bus port 204, is registered into the A/WD buffer (w10) 222a.

Also within T1, the RAM controller 200 can re-arbitrate between the two bursts from bus ports 202 and 204 to determine which burst has a higher priority to access the RAM channel 210a (or another RAM channel 210b). Additional RAM channels 210b, 210c, 210d are configured to store partial writes. As an example, through the arbitration, the burst of partial writes from bus port (BAP) 202 is selected and the request and address from the bus port 202 (BAP0=A104), are forwarded to second RAM channel 210b with address MAC1=A104 as a read request. The request from the bus port 204 at address BAP1=A204 is registered into A/WD buffer (w11) 222b.

During T2, the registered data "C0R0C0R0" from RD buffer (r0) 212a passes through the ECC decoder 214a, and is merged with partial data bytes "D102" to be written and registered in A/WD buffer (w00) 220a by bytes merger 224a to result in a new full data unit "D102C0R0". The resulting data MWDC0=D102C0R0 passes through the ECC encoder 218*a* and is written into RAM channel 210*a* with address MAC0=A100.

Within T2, second data "C0R1C0R1" read from RAM Channel 210*a* (MRDC0) is registered into RD buffer (r0) 212*a* for a second write into RAM 210*a*. Also third data "C1R0C1R0" read from RAM channel 210*b* (MRDC1) is registered into the RD buffer (r1) 212*b* for a third write into RAM channel 210*b*. Also within T2, partial write data BWDP0=D104, i.e., the second partial data unit of the first burst from bus port 202 is registered into A/WD buffer (w01) 220*b*, and partial write data BWDP1=D204, i.e., the second partial data unit of the second burst, from the bus port 204, is registered into A/WD buffer (w11) 222*b*.

Also within T2, the RAM controller 200 can re-arbitrate between the two bursts from bus ports 202 and 204 to determine which burst has a higher priority to access the RAM channel 210*a* (or another RAM channel 210*b* or 210*c*). Additional RAM channels 210*b*, 210*c*, 210*d* are configured to store partial writes. As an example, through the arbitration, the burst of partial writes from bus port (BAP) 202 is selected and the request and address from the bus port 202 (BAP0=A108), are forwarded to third RAM channel 210*c* with address MAC2=A108 as a read request. The request from bus port 204 at address BAP1=A208 is registered into A/WD buffer (w12) 222*c*.

During T3, the registered data "C0R1C0R1" from RD buffer (r0) 212*a* passes through ECC decoder 214*a*, and is merged (by bytes merger 226*a*) with partial data bytes "D202" to be written and registered in A/WD buffer (w10) 220*b*. The resulting data MWDC0=D202C0R1 passes through ECC encoder 218*a* and is written at first RAM channel 210*a* address MAC0=A200. Also within T3, the registered data "C1R0C1R0" from RD buffer (r1) 212*b* passes through ECC decoder 214*b*, and is merged (by bytes merger 224*b*) with partial data bytes "D104" to be written and registered in A/WD buffer (w01) 220*b*. The resulting data MWDC1=C1R0D104 passes through ECC encoder 218*b* and is written into second RAM channel 210*b* with address MAC1=A104.

Also within T3, fourth data "C1R1C1R1" read from RAM Channel 210*b* (MRDC1) is registered into RD buffer (r1) 212*b* for a fourth write into RAM 210*b*. Fifth data "C2R0C2R0" read from RAM channel 210*c* (MRDC2) is registered into RD buffer (r2) 212*c* for a fifth write into RAM channel 210*c*. Within T3, partial write data BWDP0=D10A, i.e., the third partial data unit of the first burst from bus port 202 is registered into A/WD buffer (w02) 220*c*, and partial write data BWDP1=D20A, i.e., the third partial data unit of the second burst, from the bus port 204, is registered into A/WD buffer (w12) 222*c*.

Also within T3, the burst of partial writes from bus port (BAP) 202 is selected and the request and address from the bus port 202 (BAP0=A10C), are forwarded to fourth RAM channel 210*d* with address MAC3=A10C as a read request. The request from bus port 204 at address BAP1=A20C is registered into A/WD buffer (w13) 222*d*.

From time T4 a similar sequence as in time T0 starts again with forwarding of the bus port request at address BAP0=A110 onto first RAM channel 210*a* at address MAC0=A110. The request from bus port 204 at address BAP1=A210 is registered into A/WD buffer (w10) 222*a*. Also, the previous partial data from the two bursts from bus ports 202 and 204 continues in a similar pattern.

For example, during time T4, the registered data "C1R1C1R1" from RD buffer (r1) 212*b* passes through ECC decoder 214*b*, and is merged (by bytes merger 226*b*) with partial data bytes "D204" to be written and registered in A/WD buffer (w11) 222*b*. The resulting data MWDC1=C1R1D204 passes through ECC encoder 218*b* and is written at second RAM channel 210*b* with address MAC1=A204. The registered data "C2R0C2R0" from RD buffer (r2) 212*c* passes through ECC decoder 214*c*, and is merged (by bytes merger 224*c*) with partial data bytes "D10A" to be written and registered in A/WD buffer (w02) 220*c*. The resulting data MWDC2=D10AC2R0 passes through ECC encoder 218*c* and is written into third RAM channel 210*c* with address MAC2=A108.

Thus, the RAM controller 200 enables to simultaneously perform RMW ECC processes for multi-bytes partial data bursts concurrently from bus ports 202 and 204 by interleaving bus port addresses from the bus ports 202 and 204 for the four RAM blocks, which enables single cycle RAM access for partial word writes. Partial write data can be accepted with no latency, and multiple data bursts can be maintained indefinitely due to available bandwidth provided by the four RAM channels connected to the two bus ports. For example, during time T3, two partial data "D10A" and "D20A" of the two bursts concurrently come in from the two bus ports 202 and 204, while two partial data "D202" and "D104" are written into first RAM channel 210*a* and second RAM channel 210*b*, respectively. During time T4, two partial data "D10C" and "D20C" of the two bursts concurrently come in from the two bus ports 202 and 204, while two partial data "D204" and "D10A" are written into second RAM channel 210*b* and third RAM channel 210*c*, respectively.

Note that, as all of the writes implied in the two concurrent burst sequences are partial writes, the four memory channels 210*a*-210*d* have 100% bus request occupancy as shown on their respective memory address channel MACx. In one example implementation, if some of the burst beats are full bus writes, then no read is needed as the ECC bits can be directly computed from the write data.

The RAM controller 200 decreases access conflict probabilities between any two bus masters trying to access the RAM channels concurrently each through one of the RAM controller bus port 202 and 204. In one example implementation, two bus masters starting simultaneously any random access to the four RAM channels have a probability of ¼ of access conflict to the same RAM channel. When a burst of partial writes with ECC is already performed by a bus master from one of the bus ports, there is a probability of ½ of access conflict with an access starting from another bus port. This is because the first bus master occupies at worst half of the available bandwidth among the four RAM channels. In case of access conflict involving at least one partial write or full bus write on one of the bus ports, the write address and data can be buffered for later completion as done for the bus port accesses in the example waveform diagram.

Various implementations may feature various numbers of buffers, delays and arbitration policies to propagate address and write data from the bus ports, through the ECC encoder and to the address channels resulting in various arrangements of the available quad channel ram bandwidth. The read data may feature various numbers of buffers and delays to pass through the ECC data decoder and bytes merge circuitry. Various implementations may features more or less bus ports and memory channels. In a particular example, for bursts of partial writes, an optimal performance is achieved when the number of memory channels is twice as large as the number of bus ports. This is because each partial write requires two memory channel accesses, one for read and one for write.

Example Flowchart

Figure 4:
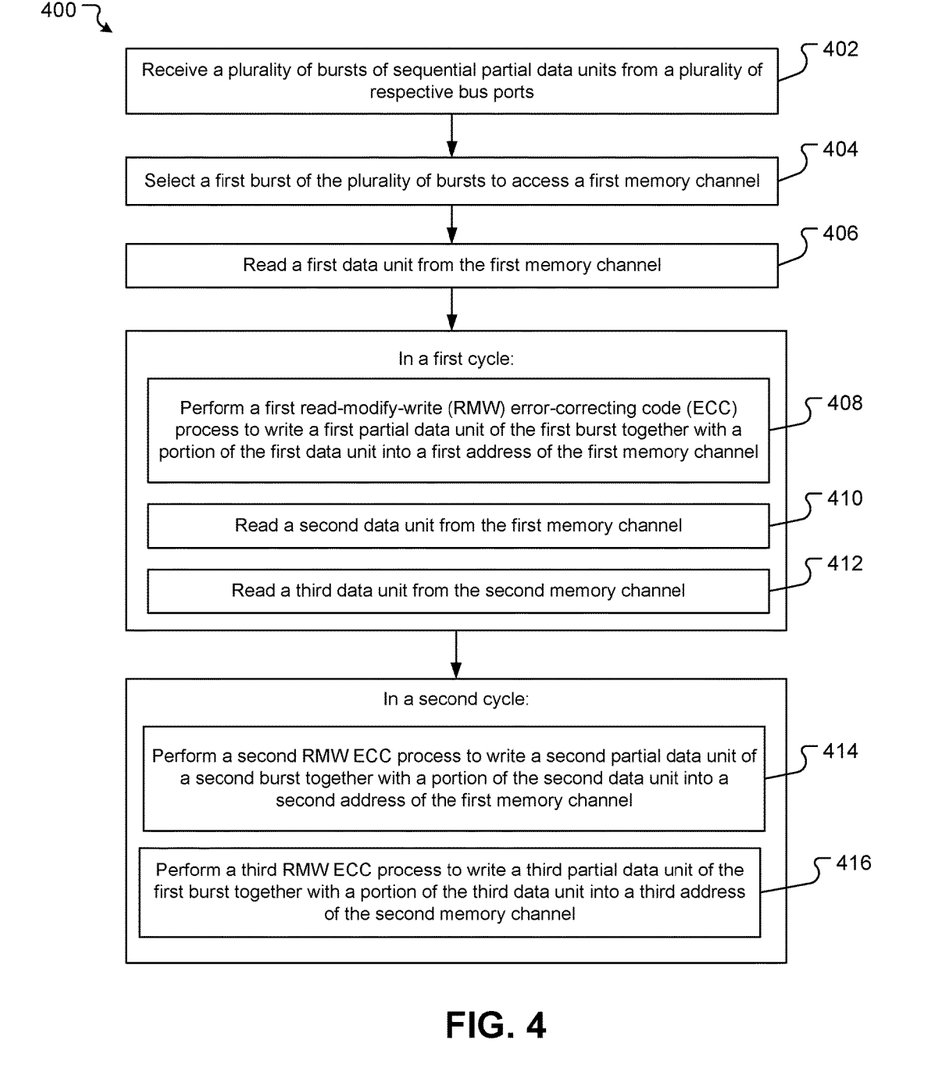
FIG. 4 is a flow diagram of an example process of concurrent bursts of partial writes to multichannel RAM system with ECC protection, according to an example embodiment.

FIG. 4 is a flow diagram of an example process 400 of multiple bursts of partial writes to multi-channel memory system with ECC protection. The process 400 is performed by a memory controller coupled to multiple memory channels. The memory channels can include static RAMs (SRAMs) or dynamic RAMs (DRAMs). The memory controller can be the RAM controller 104 of FIG. 1 or the RAM controller 200 of FIG. 2.

The controller receives, e.g., concurrently, a plurality of bursts of sequential partial data units from a plurality of respective bus ports (402). For example, the controller can receive the bursts from a number of bus masters coupled to the bus ports, e.g., a central processing unit (CPU), an I/O processor, or a peripheral processor. In an embodiment, the number of the plurality of memory channels is twice as large as the number of the plurality of bus ports.

The bursts can target a same memory channel, e.g., a first memory channel. In one example implementation, the controller receives concurrently a plurality of requests together with the plurality of bursts from the plurality of respective bus ports. Two or more requests of the plurality of requests concurrently request to write respective two or more bursts to the first memory channel.

The controller selects a first burst of the plurality of bursts to access the first memory channel (404). The controller can arbitrate among the respective two or more bursts to determine that the first burst has the highest priority to access the first memory channel.

The controller reads a first data unit from the first memory channel (406). In a first cycle, the controller performs a first read-modify-write (RMW) ECC process to write a first partial data unit of the first burst together with a portion of the first data unit into a first address of the first memory channel (408). The first data unit can be a multi-byte word with at least 32 bits, and the first RMW ECC process is associated with a multi-byte ECC with at least 32 bits. Also, in the first cycle, a second data unit is read from the first memory channel (410) and a third data unit is read from the second memory channel (412).

In an embodiment, prior to the first cycle, the controller registers the read first data unit into a first read buffer coupled to the first memory channel, the first partial data unit of the first burst into a first write buffer for the first memory channel, and the second partial data unit of the second burst into a second write buffer for the first memory channel. The first RMW ECC process includes passing the first data unit through an ECC decoder for detecting and correcting bit error in the first data unit, combining the first partial data unit of the first burst and the portion of the first data unit into a new data unit, passing the new data unit through an ECC encoder for encoding the new data unit, and writing the encoded new data unit into the first address of the first memory channel. The ECC decoder and the ECC encoder are included in the controller and configured to perform ECC protection for data read from and written into the first memory channel. The first read buffer and the first and second write buffers are also included in the controller and configured for the first memory channel.

In an embodiment, after the first partial data unit is written into the first address of the first memory channel, the controller arbitrates among the respective two or more bursts to determine that the second burst has the highest priority to access the first memory channel. In the first cycle, the controller can also register the read second data unit into the first read buffer, the third partial data unit of the first burst into a third write buffer for the second memory channel, and a fourth partial data unit of the second burst into a fourth write buffer for the second memory channel.

In the second cycle, the controller performs a second RMW ECC process to write a second partial data unit of a second burst of the plurality of bursts together with a portion of the second data unit into a second address of the first memory channel (414), and performs a third RMW ECC process to write a third partial data unit of the first burst together with a portion of the third data unit into a third address of the second memory channel, the third partial data unit being sequential to the first partial data unit in the first burst (416).

In the second cycle, the controller can also read a fourth data unit from the second memory channel, and read a fifth data unit from a third memory channel of the plurality of memory channels. In a third cycle sequential to the second cycle, the controller can perform a fourth RMW ECC process to write a fourth partial data unit of the second burst together with a portion of the fourth data unit into a fourth address of the second memory channel, the fourth partial data unit being sequential to the second partial data unit in the second burst, and perform a fifth RMW ECC process to write a fifth partial data unit of the first burst together with a portion of the fifth data unit into a fifth address of the third memory channel, the fifth partial data unit being sequential to the third partial data unit in the first burst.

In an embodiment, the controller receives concurrently the first address from a first bus port of the plurality of bus ports and the second address from a second bus port of the plurality of bus ports. In a next sequential cycle, the controller can receive concurrently the third address from the first bus port and a fourth address from the second bus port and forward the first address and the second address to the first memory channel and the third address and the fourth address to the second memory channel.

Example Concepts

In view of the foregoing, it is noted that the present technology may be implemented, for example, in accordance with the following example concepts:

1. A non-transitory computer-readable storage medium having instructions stored thereon which, when executed by one or more processors, cause the one or more processors to perform operations including: receiving concurrently a plurality of bursts of sequential partial units from a plurality of respective bus ports; selecting a first burst of the plurality of bursts to access a first memory channel of a plurality of memory channels; reading a first data unit from the first memory channel; in a first cycle: performing a first read-modify-write (RMW) error-correcting code (ECC) process to write a first partial unit of the first burst together with a portion of the first data unit into a first address of the first memory channel, reading a second data unit from the first memory channel, and reading a third data unit from a second memory channel of the plurality of memory channels; and in a second cycle sequential to the first cycle: performing a second RMW ECC process to write a second partial unit of a second burst of the plurality of bursts together with a portion of the second data unit into a second address of the first memory channel, and performing a third RMW ECC process to write a third partial unit of the first burst together with a portion of the third data unit into a third address of the second memory channel, the third partial unit being sequential to the first partial unit in the first burst.

2. The computer-readable storage medium of Concept 1, where the operations further include: in the second cycle, reading a fourth data unit from the second memory channel, and reading a fifth data unit from a third memory channel of the plurality of memory channels; and in a third cycle sequential to the second cycle, performing a fourth RMW ECC process to write a fourth partial unit of the second burst together with a portion of the fourth data unit into a fourth address of the second memory channel, the fourth partial unit being sequential to the second partial unit in the second burst, and performing a fifth RMW ECC process to write a fifth partial unit of the first burst together with a portion of the fifth data unit into a fifth address of the third memory channel, the fifth partial unit being sequential to the third partial unit in the first burst.

3. The computer-readable storage medium of Concept 1, where performing the first read-modify-write (RMW) error-correcting code (ECC) process includes: passing the first data unit through an ECC decoder for detecting and correcting bit error in the first data unit; combining the first partial unit of the first burst and the portion of the first data unit into a new data unit; passing the new data unit through an ECC encoder for encoding the new data unit; and writing the encoded new data unit into the first address of the first memory channel.

4. The computer-readable storage medium of Concept 1, where the operations further include: prior to the first cycle, registering the read first data unit into a first read buffer coupled to the first memory channel, registering the first partial unit of the first burst into a first write buffer for the first memory channel, and registering the second partial unit of the second burst into a second write buffer for the first memory channel; and, in the first cycle, registering the read second data unit into the first read buffer, registering the third partial unit of the first burst into a third write buffer for the second memory channel, and registering a fourth partial unit of the second burst into a fourth write buffer for the second memory channel.

5. The computer-readable storage medium of Concept 1, where the operations further include: receiving concurrently a plurality of requests together with the plurality of bursts from the plurality of respective bus ports, two or more requests of the plurality of requests concurrently requesting to write respective two or more bursts to the first memory channel, and where selecting a first burst of the plurality of bursts includes arbitrating among the respective two or more bursts to determine that the first burst has the highest priority to access the first memory channel.

6. The computer-readable storage medium of Concept 5, where the operations further include: after the first partial unit is written into the first address of the first memory channel, arbitrating among the respective two or more bursts to determine that the second burst has the highest priority to access the first memory channel.

7. The computer-readable storage medium of Concept 1, where addresses of the first memory channel and addresses of the second memory channel are interweaved, and where the operations further include: receiving concurrently the first address from a first bus port of the plurality of bus ports and the second address from a second bus port of the plurality of bus ports; in a next sequential cycle, receiving concurrently the third address from the first bus port and a fourth address from the second bus port; forwarding the first address and the second address to the first memory channel; and forwarding the third address and the fourth address to the second memory channel.

8. The computer-readable storage medium of Concept 1, where the first data unit is a multi-byte word with at least 32 bits, and where the first RMW ECC process is associated with a multi-byte ECC with at least 32 bits.

9. The computer-readable storage medium of Concept 1, where the plurality of memory channels is included in a synchronous random-access memory (RAM).

10. The computer-readable storage medium of Concept 1, where a number of the plurality of memory channels is twice as large as a number of the plurality of bus ports.

11. A device including: a memory controller coupled to a plurality of memory channels and configured to: receive concurrently a plurality of bursts of sequential partial units from a plurality of respective bus ports; select a first burst of the plurality of bursts to access a first memory channel of a plurality of memory channels; read a first data unit from the first memory channel; in a first cycle: perform a first read-modify-write (RMW) error-correcting code (ECC) process to write a first partial unit of the first burst together with a portion of the first data unit into a first address of the first memory channel, read a second data unit from the first memory channel, and read a third data unit from a second memory channel of the plurality of memory channels; and in a second cycle sequential to the first cycle: perform a second RMW ECC process to write a second partial unit of a second burst of the plurality of bursts together with a portion of the second data unit into a second address of the first memory channel, and perform a third RMW ECC process to write a third partial unit of the first burst together with a portion of the third data unit into a third address of the second memory channel, the third partial unit being sequential to the first partial unit in the first burst.

12. The device of Concept 11, where the memory controller is configured to: in the second cycle, read a fourth data unit from the second memory channel, and read a fifth data unit from a third memory channel of the plurality of memory channels; and in a third cycle sequential to the second cycle, perform a fourth RMW ECC process to write a fourth partial unit of the second burst together with a portion of the fourth data unit into a fourth address of the second memory channel, the fourth partial unit being sequential to the second partial unit in the second burst, and perform a fifth RMW ECC process to write a fifth partial unit of the first burst together with a portion of the fifth data unit into a fifth address of the third memory channel, the fifth partial unit being sequential to the third partial unit in the first burst.

13. The device of Concept 11, where the performing the first read-modify-write (RMW) error-correcting code (ECC) process includes: passing the first data unit through an ECC decoder for detecting and correcting bit error in the first data unit; combining the first partial unit of the first burst and the portion of the first data unit into a new data unit; passing the new data unit through an ECC encoder for encoding the new data unit; and writing the encoded new data unit into the first address of the first memory channel.

14. The device of Concept 11, where the memory controller is configured to: prior to the first cycle, register the read first data unit into a first read buffer coupled to the first memory channel, register the first partial unit of the first burst into a first write buffer for the first memory channel, and register the second partial unit of the second burst into a second write buffer for the first memory channel; and in the first cycle, register the read second data unit into the first read buffer, register the third partial unit of the first burst into a third write buffer for the second memory channel, and register a fourth partial unit of the second burst into a fourth write buffer for the second memory channel.

15. The device of Concept 11, where the memory controller is configured to: receive concurrently a plurality of requests together with the plurality of bursts from the plurality of respective bus ports, two or more requests of the plurality of requests concurrently requesting to write respective two or more bursts to the first memory channel, and where the selecting the first burst of the plurality of bursts includes arbitrating among the respective two or more bursts to determine that the first burst has the highest priority to access the first memory channel.

16. The device of Concept 11, where addresses of the first memory channel and addresses of the second memory channel are interweaved, where the memory controller is further configured to: receive concurrently the first address from a first bus port of the plurality of bus ports and the second address from a second bus port of the plurality of bus ports; in a next sequential cycle, receive concurrently the third address from the first bus port and a fourth address from the second bus port; forward the first address and the second address to the first memory channel; and forward the third address and the fourth address to the second memory channel.

17. The device of Concept 11, where the first data unit is a multi-byte word with at least 32 bits, and where the first RMW ECC process is associated with a multi-byte ECC with at least 32 bits.

18. The device of Concept 11, where the plurality of memory channels is included in a synchronous random-access memory (RAM).

19. The device of Concept 11, where a number of the plurality of memory channels is twice as large as a number of the plurality of bus ports.

20. A method including: receiving concurrently a plurality of bursts of sequential partial units from a plurality of respective bus ports; selecting a first burst of the plurality of bursts to access a first memory channel of a plurality of memory channels; reading a first data unit from the first memory channel; in a first cycle: performing a first read-modify-write (RMW) error-correcting code (ECC) process to write a first partial unit of the first burst together with a portion of the first data unit into a first address of the first memory channel, reading a second data unit from the first memory channel, and reading a third data unit from a second memory channel of the plurality of memory channels; and in a second cycle sequential to the first cycle: performing a second RMW ECC process to write a second partial unit of a second burst of the plurality of bursts together with a portion of the second data unit into a second address of the first memory channel, and performing a third RMW ECC process to write a third partial unit of the first burst together with a portion of the third data unit into a third address of the second memory channel, the third partial unit being sequential to the first partial unit in the first burst.

It is noted that the foregoing example concepts are presented for purposes of illustration, and that the present technology is not limited to these example concepts.

Particular embodiments of the subject matter described in this specification can be implemented so as to realize one or more of the following advantages. This technology can be applied for microcontrollers with internal RAM, e.g., embedded static RAM. Its data reliability can be improved with ECC protection. Combining multiport access to several interleaved RAM blocks (e.g., using interleaved addresses from multiple bus ports as RAM block/memory addresses) with multi-byte words enables single cycle RAM access for partial writes instead of several cycles. Moreover, using 32-bit ECC, 64-bit ECC or more enables a lower silicon overhead of $7/32=21.8\%$ for 32-bit RAM or $8/64=12.5\%$ for 64-bit RAM, which saves more die areas to increase RAM capability. The technology also decreases average latency to access the RAM system in case of concurrent read or write access from several bus ports when partial writes with ECC are involved. The technology enables ECC capability at low cost on embedded RAM systems, and can be applied to microcontrollers with high level of reliability, e.g., automotive or motor control products in aerospace and automotive fields.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in one example implementation be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In one example implementation, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing can be advantageous.

What is claimed is:

1. A non-transitory computer-readable storage medium having instructions stored thereon which, when executed by one or more processors, cause the one or more processors to perform operations comprising:
    accessing a plurality of bursts of partial data units from a plurality of respective bus ports;
    forming a plurality of memory addresses for a plurality of memory channels by interleaving addresses from the plurality of bus ports, wherein the interleaving of the addresses comprises:
        providing a first address from a first bus port of the plurality of bus ports to a first memory channel of the plurality of memory channels to form a first memory address,
        providing a second address from a second bus port of the plurality of bus ports to the first memory channel to form a second memory address,
        providing a third address from the first bus port to a second memory channel of the plurality of memory channels to form a third memory address, and
        providing a fourth address from the second bus port to the second memory channel to form a fourth memory address; and
    writing partial data units from the plurality of bursts into memory portions corresponding to the formed memory addresses in the plurality of memory channels.

2. The computer-readable storage medium of claim 1, wherein the third address is sequential to the first address for the first bus port, and the fourth address is sequential to the second address for the second bus port, and
    wherein the first and second memory addresses are sequential in the first memory channel, and the third and fourth memory addresses are sequential in the second memory channel.

3. The computer-readable storage medium of claim 1, wherein writing partial data units comprises performing read-modify-write (RMW) error-correcting code (ECC) processes by:
    reading a first data unit from the first memory channel;
    in a first cycle:
        performing a first RMW ECC process to write a first partial data unit of a first burst of the plurality of bursts together with a portion of the first data unit into a first memory portion corresponding to the first memory address of the first memory channel,
        reading a second data unit from the first memory channel,
        reading a third data unit from the second memory channel; and
    in a second cycle sequential to the first cycle:
        performing a second RMW ECC process to write a second partial data unit of a second burst of the plurality of bursts together with a portion of the second data unit into a second memory portion corresponding to the second memory address of the first memory channel, and
        performing a third RMW ECC process to write a third partial data unit of the first burst together with a portion of the third data unit into a third memory portion corresponding to the third memory address of the second memory channel, the third partial data unit being sequential to the first partial data unit in the first burst.

4. The computer-readable storage medium of claim 3, wherein the operations further comprise:
    in the second cycle,
        reading a fourth data unit from the second memory channel, and
        reading a fifth data unit from a third memory channel of the plurality of memory channels; and
    in a third cycle sequential to the second cycle,
        performing a fourth RMW ECC process to write a fourth partial data unit of the second burst together with a portion of the fourth data unit into a fourth memory portion corresponding to the fourth memory address of the second memory channel, the fourth partial data unit being sequential to the second partial data unit in the second burst, the fourth memory address being provided by using a fourth address from the second bus port, the fourth address being sequential to the second address for the second bus port, the fourth memory address being sequential to the third memory address in the second memory channel, and
        performing a fifth RMW ECC process to write a fifth partial data unit of the first burst together with a portion of the fifth data unit into a fifth memory portion corresponding to a fifth memory address of the third memory channel, the fifth partial data unit being sequential to the third partial data unit in the first burst, the fifth memory address being provided by using a fifth address from the first bus port, the fifth address being sequential to the third address for the first bus port.

5. The computer-readable storage medium of claim 3, wherein the operations further comprise:
prior to the first cycle,
registering the read first data unit into a first read buffer coupled to the first memory channel,
registering the first partial data unit of the first burst into a first write buffer for the first memory channel, and
registering the second partial data unit of the second burst into a second write buffer for the first memory channel; and
in the first cycle,
registering the read second data unit into the first read buffer,
registering the third partial data unit of the first burst into a third write buffer for the second memory channel, and
registering a fourth partial data unit of the second burst into a fourth write buffer for the second memory channel.

6. The computer-readable storage medium of claim 1, wherein writing partial data units comprises performing RMW ECC processes by:
passing a data unit from a memory channel of the plurality of memory channels through an ECC decoder for detecting and correcting bit error in the data unit;
combining a partial data unit of a burst of the plurality of bursts and a portion of the data unit into a new data unit;
passing the new data unit through an ECC encoder for encoding the new data unit; and
writing the encoded new data unit into a memory portion corresponding to a memory address of the memory channel.

7. The computer-readable storage medium of claim 1, wherein the operations further comprise:
receiving concurrently a plurality of requests together with the plurality of bursts from the plurality of respective bus ports, two or more requests of the plurality of requests concurrently requesting to write respective two or more bursts to the first memory channel,
selecting a first burst of the plurality of bursts by arbitrating among the respective two or more bursts to determine that the first burst has the highest priority to access the first memory channel.

8. The computer-readable storage medium of claim 7, wherein the operations further comprise:
after the first partial data unit is written into the first address of the first memory channel, arbitrating among the respective two or more bursts to determine that a second burst has the highest priority to access the first memory channel.

9. The computer-readable storage medium of claim 1, wherein a partial data unit from the plurality of bursts is associated with a multi-byte word with at least 32 bits, and
wherein writing partial data units comprises performing RMW ECC processes, and the RMW ECC processes include a multi-byte ECC with at least 32 bits.

10. The computer-readable storage medium of claim 1, wherein the plurality of memory channels is included in a synchronous random-access memory (RAM).

11. The computer-readable storage medium of claim 1, wherein a number of the plurality of memory channels is twice as large as a number of the plurality of bus ports.

12. A device comprising:
a memory controller coupled to a plurality of bus ports and a plurality of memory channels and configured to:
access a plurality of bursts of partial data units from a plurality of respective bus ports;
form a plurality of memory addresses for a plurality of memory channels by interleaving addresses from the plurality of bus ports, wherein the interleaving of the addresses comprises:
providing a first address from a first bus port of the plurality of bus ports to a first memory channel of the plurality of memory channels to form a first memory address,
providing a second address from a second bus port of the plurality of bus ports to the first memory channel to form a second memory address,
providing a third address from the first bus port to a second memory channel of the plurality of memory channels to form a third memory address, and
providing a fourth address from the second bus port to the second memory channel to form a fourth memory address; and
write partial data units from the plurality of bursts into memory portions corresponding to the formed memory addresses in the plurality of memory channels.

13. The device of claim 12, wherein the third address is sequential to the first address for the first bus port, and the fourth address is sequential to the second address for the second bus port, and
wherein the first and second memory addresses are sequential in the first memory channel, and the third and fourth memory addresses are sequential in the second memory channel.

14. The device of claim 12, wherein the writing of partial data units comprises performing read-modify-write (RMW) error-correcting code (ECC) processes by:
reading a first data unit from the first memory channel;
in a first cycle:
performing a first RMW ECC process to write a first partial data unit of a first burst of the plurality of bursts together with a portion of the first data unit into a first memory portion corresponding to the first memory address of the first memory channel,
reading a second data unit from the first memory channel,
reading a third data unit from the second memory channel; and
in a second cycle sequential to the first cycle:
performing a second RMW ECC process to write a second partial data unit of a second burst of the plurality of bursts together with a portion of the second data unit into a second memory portion corresponding to the second memory address of the first memory channel, and
performing a third RMW ECC process to write a third partial data unit of the first burst together with a portion of the third data unit into a third memory portion corresponding to the third memory address of the second memory channel, the third partial data unit being sequential to the first partial data unit in the first burst.

15. The device of claim 14, wherein the memory controller is configured to:
prior to the first cycle,
register the read first data unit into a first read buffer coupled to the first memory channel, register the first partial data unit of the first burst into a first write buffer for the first memory channel, and register the second partial data unit of the second burst into a second write buffer for the first memory channel; and in the first cycle, register the read second data unit into the first read buffer, register the third partial data unit of the first burst into a third write buffer for the second memory channel, and register a fourth partial data unit of the second burst into a fourth write buffer for the second memory channel.

16. The device of claim 12, wherein the writing of partial data units comprises performing RMW ECC processes by:

passing a data unit from a memory channel of the plurality of memory channels through an ECC decoder for detecting and correcting bit error in the data unit;

combining a partial data unit of a burst of the plurality of bursts and a portion of the data unit into a new data unit;

passing the new data unit through an ECC encoder for encoding the new data unit; and writing the encoded new data unit into a memory portion corresponding to a memory address of the memory channel.

17. The device of claim 12, wherein the memory controller is configured to:

receive concurrently a plurality of requests together with the plurality of bursts from the plurality of respective bus ports, two or more requests of the plurality of requests concurrently requesting to write respective two or more bursts to the first memory channel, select a first burst of the plurality of bursts by arbitrating among the respective two or more bursts to determine that the first burst has the highest priority to access the first memory channel.

18. The device of claim 12, wherein a partial data unit from the plurality of bursts is associated with a multi-byte word with at least 32 bits, and wherein the writing of partial data units comprises performing RMW ECC processes, and the RMW ECC processes include a multi-byte ECC with at least 32 bits.

19. The device of claim 12, wherein a number of the plurality of memory channels is twice as large as a number of the plurality of bus ports.

20. A method comprising:

accessing a plurality of bursts of partial data units from a plurality of respective bus ports;

forming a plurality of memory addresses for a plurality of memory channels by interleaving addresses from the plurality of bus ports, wherein the interleaving of the addresses comprises:

providing a first address from a first bus port of the plurality of bus ports to a first memory channel of the plurality of memory channels to form a first memory address, providing a second address from a second bus port of the plurality of bus ports to the first memory channel to form a second memory address, providing a third address from the first bus port to a second memory channel of the plurality of memory channels to form a third memory address, and providing a fourth address from the second bus port to the second memory channel to form a fourth memory address; and writing partial data units from the plurality of bursts into memory portions corresponding to the formed memory addresses in the plurality of memory channels.

\* \* \* \* \*